United States Patent [19]
Stanssens et al.

[11] Patent Number: 6,124,371
[45] Date of Patent: Sep. 26, 2000

[54] ANIONIC PHOTOCATALYST

[75] Inventors: Dirk A. W. Stanssens, Houthalen, Belgium; Johan F. G. A. Jansen, Geleen, Netherlands

[73] Assignee: DSM N.V., Heerlen, Netherlands

[21] Appl. No.: 09/137,836

[22] Filed: Aug. 21, 1998

Related U.S. Application Data

[60] Provisional application No. 60/012,414, Feb. 28, 1996.

[30] Foreign Application Priority Data

Feb. 22, 1996 [EP] European Pat. Off. ............ 96200466

[51] Int. Cl.⁷ .......................... C08F 2/50; G03F 7/004; C09D 4/00
[52] U.S. Cl. ................... 522/27; 522/28; 522/39; 522/50; 522/57; 522/63; 522/65; 522/182; 522/104; 522/167; 522/170; 522/173; 522/178; 522/184; 522/186; 522/188; 522/189; 430/280.1; 430/281.1; 430/285.1; 430/269
[58] Field of Search .................... 522/65, 28, 27, 522/39, 50, 57, 63, 120, 167, 170, 178, 179, 180, 148, 173, 184, 186, 188, 189; 430/280.1–288.1, 269

[56] References Cited

U.S. PATENT DOCUMENTS

| | | | |
|---|---|---|---|
| 3,877,941 | 4/1975 | Lohmann | 430/374 |
| 4,301,186 | 11/1981 | Mayer et al. | 427/519 |
| 5,545,509 | 8/1996 | Cameron et al. | 430/270.1 |
| 5,595,856 | 1/1997 | Mochizuki et al. | 430/270.1 |
| 5,639,802 | 6/1997 | Neckers et al. | |

FOREIGN PATENT DOCUMENTS

| | | |
|---|---|---|
| 0425142 | 5/1991 | European Pat. Off. |
| 20 20 937 | 11/1971 | Germany . |
| 95 14716 | 6/1995 | WIPO . |

*Primary Examiner*—Susan W. Berman
*Attorney, Agent, or Firm*—Pillsbury Madison & Sutro Intellectual Property Group

[57] ABSTRACT

The invention relates to a composition comprising polymerizable material and an anionic photocatalyst. The photocatalyst is a photolabile compound able to liberate a strong base having a $pK_a \geq 12$. The catalyst can be illustrated by the structural formula Z-A wherein Z is a photolabile group and A is a strong base, for example, a nitrogen containing compound such as, a secondary amine, a guanidine or amidine and Z is covalently bound to A.

13 Claims, No Drawings

ANIONIC PHOTOCATALYST

This application is a continuation of PCT/NL97/00042 filed Feb. 7, 1997 and also claims the benefit of Provisional Application Ser. No. 60/012,414, filed Feb. 28, 1996.

FIELD OF THE INVENTION

The invention relates to an anionic photocatalyst and to a composition comprising a polymerizable material and the anionic photocatalyst.

BACKGROUND OF THE INVENTION

A photocatalyst is a species that efficiently absorbs ultraviolet light and generates, through a series of photochemical energy transformations, an initiator or a catalyst which is capable of initiating or catalyzing polymerization. A photocatalyst which upon absorption of ultraviolet light transfers into an electronically excited state and is directly involved in the production of initiator radicals is known as a photoinitiator.

Photoinitiators are well known for use in initiation of polymerization and crosslinking processes. Upon subjection to light or irradiation all suitable wave length, the photoinitiator produces a reactive species which can initiate the polymerisation or crosslinking process. Most common are radical photoinitiator, where the reactive species is a radical. Polymerization can also proceed using a photocatalyst which produces after irradiation an acid (cationic photocatalyst) or a base (anionic photocatalyst) as reactive species. Of these photocatalysts, the anionic photocatalysts are relatively rare.

A composition comprising a binder and an anionic photoactive compound is known from E. J. Urankar and J. M. J Frechet, Polymer Preprints Vol. 35 (II), 933–34 (1994). Said article describes the crosslinking of a copolymer film by free amine liberated from a photocatalyst. The catalyst disclosed in said article has as a disadvantage not to be active in the catalysis of some polymerisation- and crosslinking reactions such as, for example, several Michael type additions and epoxide additions.

SUMMARY AND OBJECTS OF THE INVENTION

It is an object of the present invention to provide a more effective anionic photocatalyst. It is another object of the invention to provide a composition comprising an anionic photocatalyst having good stability and good solubility in polymerizable material.

A composition according to the present invention comprises:
a) polymerizable material and
b) an anionic photocatalyst being a photolabile compound able to liberate a strong base with a $pK_a \geq 12$.

The structural formula of the photocatalyst can be illustrated as follows:

Z-A wherein Z is a photolabile group, A is a strong base and Z is covalently bound to A. The strong base is preferably a nitrogen containing compound. Preferred nitrogen containing compounds include amines, for example, secondary amines, guanidines and amidines.

The invention further relates to specific nitrogen containing compounds for use as photocatalysts.

PRIOR ART

T. Nishikubo, E. Takehara and A. Kameyama (Polymer J, no. 4, 25 (1993), 421–425) describe the thermal curing of epoxy resin and the polyurethane oligomer with bis (4-formylaminophenyl)methane as a photocatalyst. The base generated is an aromatic amine, which amine is a weak base and functions as a crosslinking agent.

Cameron and Fréchet (J. Photochem. Photobiol. A: Chem. 59, (1991) 105–113) disclose anionic photocatalysts being amines having a $\alpha,\alpha$-dimethyl-3,5-dimethoxybenzyloxycarbonyl moiety. The base according to the example of this reference is cyclohexylamine, which is not very effective.

WO-95/31486 discloses anionic photocatalysts consisting of platinum, iron or ruthenium complexes.

DE-A-2020937 describes N-acylguanidines having the general formula:

$$R^1_{\phantom{1}}\!\!\diagdown\!\!\underset{R^2\diagup}{N}\!\!-\!\!\underset{\underset{\underset{R^3\diagup\diagdown R^4}{N}}{(NH)_m}}{C}\!\!=\!\!N\!\!-\!\!\overset{O}{\underset{\|}{C}}\!\!-\!\!(O)_{\overline{n}}\!\!-\!\!R$$

wherein R, $R^1$, $R^2$, $R^3$ and $R^4$ are substituted or unsubstituted aliphatic, aromatic or heterocyclic groups. This general formula can overlap with the general formula of the photocatalyst according to the present invention, in case that n=1, m=0, $R^1$, $R^2$, $R^3$ and $R^4$ are $CH_3$— and R is phenyl-$CH_2$. DE-A-2020937 discloses the use of these N-acylguanidines as a plant protection agent. There is nowhere given a disclosure or a suggestion for the use of said guanidine as a photocatalyst or for the use in a photocurable composition.

DETAILED DESCRIPTION OF THE INVENTION

The anionic photocatalyst according to the present invention is able to liberate a strong base having a $pK_a$ about $\geq 12$.

Preferably, the anionic photocatalyst has the following structure:

Z-A wherein Z is a photolabile group, A is a strong base and Z is covalently bound to A.

The strong base is preferably a nitrogen containing compound.

The photolabile group Z can be any group that decomposes under the influence of irradiation (such as for example, ultraviolet light, electron beam, infrared or laser irradiation) in such a way that a strong base is liberated from the compound with the formula Z-A.

Examples of suitable labile groups include fluorenones, xanthones, thioxanthones, biphenyls and arylalkoxycarbonyls such as for example m-nitrophenyl oxycarbonyl, 3,5-dimethoxybenzyloxycarbonyl, and o-nitrobenzyloxycarbonyl, 3,4-dimethoxy-o-nitrobenzyloxycarbonyl and phenyl-(o-nitrophenyl) methyloxycarbonyl.

A preferred labile group Z is an arylalkoxycarbonyl group having the formula:

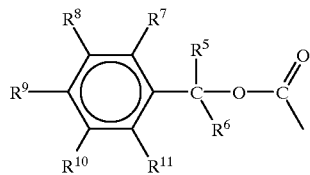

in which $R^5$, $R^6$, $R^7$, $R^8$, $R^9$, $R^{10}$ and $R^{11}$ can be independently a group selected from hydrogen, ($C_1$–$C_{20}$) alkyl, aryl, aryl-alkyl, halogen, alkyl-O—, aryl-O—, aryl-alkyl-O—, alkyl-S—, aryl-S—, aryl-alkyl-S—, alkyl-N—, aryl-N—, acryl-alkyl-N, $NO_2$—, cyano, carboxylic esters, carboxylic amides, ketones or aldehydes in which $R^5$, $R^6$, $R^7$, $R^8$, $R^9$, $R^{10}$ and $R^{11}$ can also form one or more ringstructures.

Preferably $R^5$, $R^6$, $R^7$, $R^8$, $R^9$, $R^{10}$ and $R^{11}$ are hydrogen atoms.

In one preferred embodiment of the invention $R^8$ and $R^{10}$ are methoxy groups and $R^5$ and $R^6$ are methyl groups.

In another preferred embodiment $R^7$ and/or $R^{11}$ are —$NO_2$.

In a further preferred embodiment $R^8$ and $R^{10}$ are —$OCH_3$, $R^5$ is H and $R^6$ is

In yet another preferred embodiment $R^9$ is an arylgroup and $R^5$ and $R^6$ are methylgroups.

In the formula Z-A, A can be, for example, a secondary amine, a guanidine or an amidine group. Suitable secondary amines include, for example, diisopropylamine and ethylhexylamine. The guanidine groups are for example described in EP-A-490422.

Preferably A has the following formula:

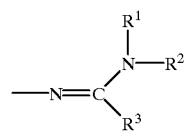

According to a further preferred embodiment A is represented by the formula:

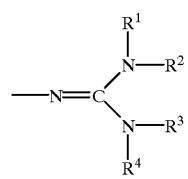

In these formulas $R^1$, $R^2$, $R^3$ and $R^4$ can be independently a group selected from hydrogen, ($C_1$–$C_{20}$) alkyl, aryl, aryl-alkyl, halogen, alkyl-O—, aryl-O—, aryl-alkyl-O—, aryl-N—, alkyl-N, aryl-alkyl-N, alkyl-S—, aryl-S—, aryl-alkyl-S—, $NO_2$—, cyano, carboxylic ester carboxylic amide, ketones or aldehydes, whereas $R^1$, $R^2$, $R^3$ and/or $R^4$ can also form ringstructures and wherein $R^5$, $R^6$, $R^7$, $R^8$, $R^9$, $R^{10}$ and $R^{11}$ can also form independently from $R^1$, $R^2$, $R^3$ and $R^4$ one or more ringstructures.

A preferred anionic photocatalyst (Z-A) has the following formula:

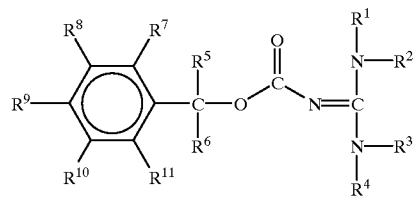

Preferably, $R^1$, $R^2$, $R^3$ and $R^4$ are methyl groups and $R^5$ to $R^{11}$ are hydrogen atoms.

In another preferred embodiment $R^1$, $R^2$, $R^3$, $R^4$, $R^5$ and $R^6$ are methyl groups, $R^8$ and $R^{10}$ are methoxy groups and $R^7$, $R^9$ and $R^{11}$ are hydrogen atoms.

According to a further preferred embodiment $R^1$, $R^2$, $R^3$ and $R^4$ are methyl groups, $R^7$ is a nitro group and $R^5$, $R^6$, $R^8$, $R^9$, $R^{10}$ and $R^{11}$ are hydrogen atoms.

In another preferred embodiment of the present invention $R^1$, $R^2$, $R^3$ and $R^4$ are methyl groups, $R^7$ and $R^{11}$ are nitro groups and $R^5$, $R^6$, $R^8$, $R^9$ and $R^{10}$ are hydrogen atoms.

It is also advantageous to select $R^1$, $R^2$, $R^3$ and $R^4$ methyl, $R^5$, $R^7$, $R^9$ and $R^{11}$ hydrogen, $R^6$

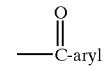

and $R^8$ and $R^{10}$ methoxy groups or $R^1$, $R^2$, $R^3$, $R^4$, $R^5$ and $R^6$ methyl groups, $R^9$ aryl and $R^7$, $R^8$, $R^{10}$ and $R^{11}$ hydrogen.

The polymerizable material according to the present invention is an anionic curable composition comprising one or more polymerizable components such as monomers, oligomers or polymers.

Suitable polymerisable components include, for example, aldehydes, ketones, ethylenically unsaturated monomers including ethylene, 1,3-dienes, styrene and a-methyl styrene, acrylates and methacrylates, itaconates, (meth) acrylonitrile, (meth)acrylamide, N-carboxy-α-amino anhydrides, cyclic amides, cyclic esters, epoxides and siloxanes. Furthermore components having for example an amine, thiol, epoxide, carboxyl, isocyanate, (meth)acrylate, unsaturated carbonyl, cyclic carbonate, acetoacetate, malonate or alcohol functionality can be applied.

Other suitable polymers include for example polyacrylates, polyolefins, (un)saturated polyesters, polyamides, polyethers and hydrocarbon polymers having above mentioned functionalities as end group, in a side chain or in the backbone.

The polymerizable material can be a combination of suitable components such as for example acetoacetate-(meth)acrylate, thiol-epoxide, thiol-unsaturated carbonyl, thiol-isocyanate, carboxylic acid-epoxide, amino-cyclic carbonate, thiol-cyclic carbonate, hydroxy-isocyanate, malonate-acrylate, ketone-acrylate and amine-unsaturated carboxyl mixtures.

The concentration of the anionic photocatalyst can range between, for example, 0,01 and 10% by weight (relative to the polymerisable material). The irradiation conditions and the amount of photocatalyst and other additives is dependent upon formulation and application end-use requirements.

Other suitable additives include for example pigments and sensitizers. Suitable sensitizers are for example summarized in WO 95/14716.

The products according to the present invention can be used in coatings and inks serving for example the printing and packaging industry and also in other markets including for example wood, adhesives, photo-imaging, fibre optics, printing plates and 3D photomodelling. The use in the coating industry can be in powder paint formulations for powder coatings but also in water based coatings, solvent based coatings and 100% solid system in wet-coatings.

The photocatalyst according to the invention can also be used in photoimaging and photoresist material, where the photocatalyst can cause direct crosslinking or can also be used to neutralise the acid in acid cure systems, such that areas which are not exposed to light can cure.

The compound according to the present invention can also be applied as a strong base generating species, as a neutralising agent, and also as an alkaline making agent, because the pH shift in a coating caused by the liberation of the strong base can be used for color changes in colored systems in which pH sensitive dyes are incorporated.

The invention will further be described based on the following non-limiting examples.

Experiment I

Preparation of benzyloxycarbonyl tetramethylquanidine (Z-TMG)

To a stirred solution of 88 g benzyloxycarbonyl hydroxysuccinimid in 300 ml dichloromethane was slowly added 41 g tetramethyl guanidine in 100 ml dichloromethane. The reaction mixture was stirred overnight and subsequently washed with water (3 times 100 ml) and a saturated sodium carbonate solution (3 times 100 ml). These washings were followed by a very quick washing with 100 ml of 0.1 n hydrochloric acid solution followed by washing with a saturated sodium carbonate solution and water. Drying over sodium sulphate was followed by evaporation of the solvent under reduced pressure. 70 g (80%) Z-TMG was obtained.
$^1$H-NMR: 200 MHz, CDCl$_3$δ: 7.5–7.2 (m, 5H) 5.15 (s, 2H) 2.9 (s, 12H).

EXAMPLE I

Curing of an unsaturated polyester and pentaerythritol-tetrakis(3-mercaptopropionate) mixture with Z-TMG 5 g unsaturated polyester (ZA1832 DSM Resins, WPU= 750), 0.9 g pentaerythritol-tetrakis(3-mercaptopropionate) and 0.3 g Z-TMG according to Experiment I were dissolved in 5 ml tetrahydrofurane (THF). A 150 μm coating was drawn on an alumina Q-panel and the THF was evaporated from the coating overnight. The coating was irradiated during 10 sec with a mercury lamp (dose 3 J/cm$^2$). After irradiation a coating was formed (as was proved with the acetone resistance test which test resulted in ADR>100).

In said test more than 100 acetone double rubs (>100 ADR) indicates full curing, whereas 25–100 acetone double rubs indicates a partial curing. Without irradiation the ADR was 4, which means that there was no curing.

COMPARATIVE EXPERIMENT A

Attempted cure with α-nitro-benzyloxycarbonyl cyclohexylamine

Example I was repeated with the exception that instead of Z-TMG, α-nitro-benzyloxycarbonyl cyclohexylamine was applied.

Result: No curing was observed after irradiation. (ADR=4)

COMPARATIVE EXPERIMENT B

Attempted cure with benzyloxycarbonyl benztriazole

Example I was repeated with the exception that instead of Z-TMG benzyloxycarbonyl benztriazole was applied.

Result: No curing was observed after irradiation. (ADR=4)

EXAMPLE II

Curing of a carboxylic acid epoxide mixture with Z-TMG 11.7 g (Uralac P$_{3500}$™; acid value=35, DSM Resins), 0.62 g trisglycidylisocyanurate (TGIC) and 0.2 g Z-TMG were dissolved in 10 ml THF. A coating was drawn according to Example I and the coating was irradiated during 10 sec (dose 3 J/cm$^2$). After the irradiation the coating underwent a post-cure treatment for 10 min at 150° C.

Result: A crosslinked coating was obtained (ADR>100).

COMPARATIVE EXPERIMENT C

Z-TMG without irradiation

Analogous to Example II, a coating was prepared, however the coating was not irradiated.

Result: Hardly any crosslinking was observed. (ADR=20)

COMPARATIVE EXPERIMENT D

Blank without catalyst

Coatings were prepared analogous to Example II, however no Z-TMG catalyst was used.

Result: No crosslinking was observed. (ADR=10)

COMPARATIVE EXPERIMENT E

Curing with TMG

Coatings were prepared analogous to Example II, with the exception that TMG instead of Z-TMG was used as catalyst.

Result: Crosslinking was observed (ADR>100) without irradiation, however the coating composition was not stable because the catalyst was not blocked.

EXAMPLE III

Curing of an acrylate/acetoacetate mixture with Z-TMG

Analogous to Example I a coating was prepared from the following mixture: 6.6 g of an acrylate functional polyacrylate having a WPU=660, 1.3 g of pentaerythritol trisacetoacetate and 0.065 g Z-TMG.

After irradiation a cured coating having an aceton resistance ADR>100 and having a König pendulum hardness of 158 sec. was obtained.

EXAMPLE IV

Example III was repeated, however, before irradiation 8 g of the pigment TiO$_2$ was homogeneously dispersed in the mixture. Immediately after irradiation for 40 sec (12 J/cm$^2$) the surface seemed cured (visual) but no through cure could be detected (ADR=7).

The coating was followed for depth of cure (cure without irradiation) during a week.

Result: 1 hour: ADR 18; 1 day ADR 30; 2 days: ADR 52, 1 week ADR>100, indicating that the liberated catalyst remains active.

This constitutes a major advantage of anionic curing mechanism over a radical curing mechanism, as radicals have a very short life-time.

EXAMPLE V

Example III was repeated with as the acrylate an epoxyacrylate (Sartomer CN120™) and 0.4% by weight Z-TMG as catalyst whereas THF was omitted as solvent.

A coating having a thickness of 75 μm drawn from this liquid on a glass plate and cured with 3 J/cm$^2$ (using a Fusion D-bulb as source of UV light).

Result: After irradiation a cured coating was obtained.

EXAMPLE VI

Example III was repeated with urethane acrylate (Sartomer CN 963-A80™) as the acrylate and the amount of Z-TMG was raised to 3% by weight. A coating having a thickness of 75 μm drawn from this liquid on a glass plate and cured with 1 J/cm² (using a Fusion D-bulb as source of UV light).

Result: After irradiation a cured coating was obtained.

EXAMPLE VII

Example III was repeated with polyester acrylate (Ebecryl 810™) as the acrylate.

A coating having a thickness of 75 μm drawn from this liquid on a glass plate and cured with 3 J/cm² (using a Fusion D-bulb as source of UV light).

Result: After irradiation a cured coating was obtained.

EXAMPLE VIII

Example VII was repeated with the exception that also 6% by weight benzophenone was added as a sensitizer.

Result: only a dose of 0,5 J/cm² was needed to obtain a cured coating.

These examples show that irradiation of a composition comprising a photocatalyst according to the invention results in cured coatings.

What is claimed is:

1. A composition comprising:
   a) a polymerizable material; and
   b) an anionic photocatalyst represented by the formula Z-A;
   wherein Z is a photolabile group, A is a strong base, and Z is covalently bound to A; and
   wherein the anionic photocatalyst is a photolabile compound that liberates strong base having a pKa≧12 upon irradiation.

2. Composition according to claim 1, characterized in that, the strong base is a nitrogen containing compound.

3. Composition according to claim 2, characterized in that the nitrogen containing compound is an amine.

4. Composition according to claim 3; characterized in that the amine is a secondary amine, a guanidine or an amidine.

5. Composition according to claim 1 or 2–4 characterized in that the anionic photocatalyst has the structural formula:

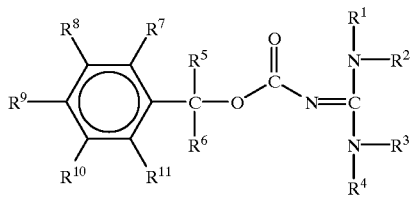

wherein $R^1$, $R^2$, $R^3$, $R^4$, $R^5$, $R^6$, $R^7$, $R^8$, $R^9$, $R^{10}$ and $R^{11}$ can be independently a group selected from hydrogen, ($C_1$–$C_{20}$) alkyl, aryl, aryl-alkyl, halogen, alkyl-O—, aryl-O—, aryl-alkyl-O—, aryl-N—, alkyl-N—, aryl-alkyl-N, alkyl-S—, aryl-S—, aryl-alkyl-S—, $NO_2$—, cyano, carboxylic ester, carboxylic amide, ketones or aldehydes and wherein $R^1$, $R^2$, $R^3$ and/or $R^4$ can also form a ringstructure and wherein $R^5$, $R^6$, $R^7$, $R^8$, $R^9$, $R^{10}$ and $R^{11}$ can also form independently from $R^1$, $R^2$, $R^3$ and $R^4$ one or more ringstructures.

6. Composition according to claim 1 characterized in that the composition comprises 0.01–10% by weight of the anionic photocatalyst.

7. Radiation curable coating composition comprising a composition according to claim 1.

8. A method for photopolymerizing the composition of claim 1, comprising:

exposing the composition to irradiation that liberates a base having a pKa≧12 from said anionic photocatalyst.

9. Catalyst having the structural formula:

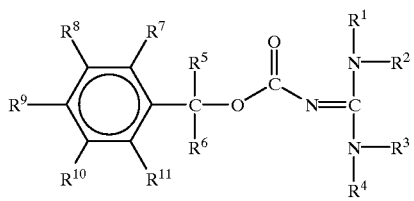

characterized in that $R^1$, $R^2$, $R^3$ and $R^4$ are methyl groups and $R^5$ to $R^{11}$ are hydrogen atoms or in that $R^1$, $R^2$, $R^3$, $R^4$, $R^5$ and $R^6$ are methyl groups, $R^8$ and $R^{10}$ are methoxy groups and $R^7$, $R^9$ and $R^{11}$ are hydrogen atoms or in that $R^1$, $R^2$, $R^3$ and $R^4$ are methyl groups, $R^7$ is a nitro group and $R^5$, $R^6$, $R^8$, $R^9$, $R^{10}$ and $R^{11}$ are hydrogen atoms or in that $R^1$, $R^2$, $R^3$ and $R^4$ are methyl groups $R^7$ and $R^{11}$ are nitro groups and $R^5$, $R^6$, $R^8$, $R^9$ and $R^{10}$ are hydrogen atoms or in that $R^1$, $R^2$, $R^3$ and $R^4$ are methyl, $R^5$, $R^7$, $R^9$ and $R^{11}$ are hydrogen, $R^6$ is

and $R^8$ and $R^{10}$ are methoxy groups or in that $R^1$, $R^2$, $R^3$, $R^4$, $R^5$ and $R^6$ are methyl groups, $R^9$ is aryl and $R^7$, $R^8$, $R^{10}$ and $R^{11}$ are hydrogen excluding a compound having the formula:

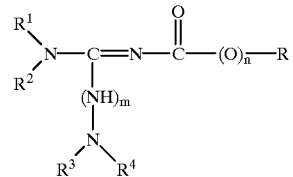

wherein n=1, m=0, $R^1$, $R^2$ $R^3$ and $R^4$ are —$CH_3$ and R is phenyl-$CH_2$.

10. Composition according to claim 1 characterized in that the anionic photocatalyst is a compound according to claim 8.

11. A photocatalyst represented by the formula Z-A, wherein Z and A are covalently bound, Z represents a photolabile group, and A is a base represented by the formula:

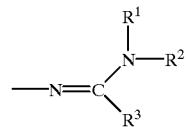

wherein $R^1$, $R^2$, and $R^3$ independently represent hydrogen, ($C_1$–$C_{20}$) alkyl, aryl, aryl-alkyl, halogen, alkyl-O—, aryl-N—, alkyl-N, aryl-alkyl-N, alkyl-S—, aryl-S—, aryl-alkyl-S—, $NO_2$—, cyano, carboxylic ester, carboxylic amide, ketones or aldehydes, and wherein $R^1$, $R^2$ and/or $R^3$ can also form ring structures; and wherein said photocatalyst is able to liberate said base upon irradiation.